(12) United States Patent
Lawton (10) Patent No.: US 12,247,853 B2
(45) Date of Patent: Mar. 11, 2025

(54) SYSTEMS AND METHODS FOR PLUNGER MOVEMENT DETECTION

(71) Applicant: Renesas Electronics America Inc., Milpitas, CA (US)

(72) Inventor: Joshua Charles Lawton, Franklin, MI (US)

(73) Assignee: Renesas Electronics America Inc., Milpitas, CA (US)

( * ) Notice: Subject to any disclaimer, the term of this patent is extended or adjusted under 35 U.S.C. 154(b) by 141 days.

(21) Appl. No.: 18/156,728

(22) Filed: Jan. 19, 2023

(65) Prior Publication Data

US 2024/0247954 A1 Jul. 25, 2024

(51) Int. Cl.
*G01D 5/20* (2006.01)
*G01R 19/10* (2006.01)
*G01R 19/165* (2006.01)

(52) U.S. Cl.
CPC ........... *G01D 5/2006* (2013.01); *G01R 19/10* (2013.01); *G01R 19/1659* (2013.01)

(58) Field of Classification Search
None
See application file for complete search history.

(56) References Cited

U.S. PATENT DOCUMENTS

| | | | | |
|---|---|---|---|---|
| 6,917,203 B1 * | 7/2005 | Perotti | ................... | G01R 31/72 324/546 |
| 2016/0125993 A1 * | 5/2016 | Narayanasamy | ..... | H01F 7/1844 361/160 |
| 2020/0328019 A1 * | 10/2020 | Casiraghi | .............. | H01F 7/1844 |
| 2023/0230741 A1 * | 7/2023 | Zhou | ................... | F16K 37/0041 361/170 |
| 2024/0029978 A1 * | 1/2024 | Berveling | .......... | G01R 31/3275 |

* cited by examiner

*Primary Examiner* — Jas A Sanghera
(74) *Attorney, Agent, or Firm* — SCULLY, SCOTT, MURPHY & PRESSER, P.C.

(57) ABSTRACT

Systems and methods for detecting a plunger movement condition with respect to a solenoid coil are described. A method may include generating a first derivative signal waveform of a current flowing in the solenoid coil, identifying whether there is at least one zero crossing point in the first derivative signal waveform, and detecting the plunger movement condition according to an identification result indicating whether there is at least one zero crossing point in the first derivative signal waveform.

16 Claims, 10 Drawing Sheets

SYSTEMS AND METHODS FOR PLUNGER MOVEMENT DETECTION

BACKGROUND

The present disclosure relates in general to detecting a plunger movement condition. More specifically, the present disclosure relates to detecting a plunger movement condition with respect to a solenoid coil according to a first derivative signal waveform of a current flowing in the solenoid coil.

Electromechanical solenoids are widely used in various applications, such as valves, relays and contactors. An electromechanical solenoid may consist of an electromagnetically inductive coil wound around a movable steel or iron slug called a plunger or an armature. The coil can be shaped such that the plunger may be moved in and out of its center, altering the coil's inductance. The detection of the plunger movement can ensure a proper operation of the valves, relays or contactors.

SUMMARY

Embodiments are directed to a method for detecting a plunger movement condition with respect to a solenoid coil. The method includes generating a first derivative signal waveform of a current flowing in the solenoid coil, identifying whether there is at least one zero crossing point in the first derivative signal waveform, and detecting the plunger movement condition according to an identification result indicating whether there is at least one zero crossing point in the first derivative signal waveform.

Embodiments are also directed to a semiconductor device including a controller that is configured to detect a plunger movement condition with respect to a solenoid coil according to a first derivative signal waveform of a current flowing in the solenoid coil.

Embodiments are also directed to a system including a plunger, a solenoid coil, and a controller being configured to detect a plunger movement condition with respect to the solenoid coil according to a first derivative signal waveform of a current flowing in the solenoid coil.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawings, like reference numbers indicate identical or functionally similar elements.

Figure 1:
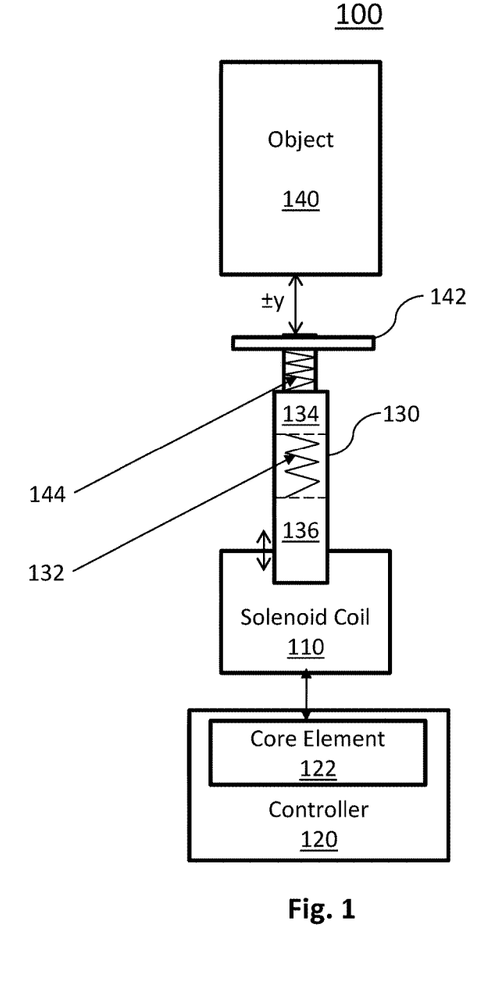
FIG. 1 is a diagram illustrating a system that may implement plunger movement detection according to an example embodiment.

FIG. 1 is a diagram illustrating a system 100 that may implement plunger movement detection according to an example embodiment.

Referring to FIG. 1, the system 100 may include a solenoid coil 110, a plunger 130, a controller 120, and an object 140. The controller 120 can be configured to detect movements of the plunger 130, such as whether the plunger 130 is moving in or out of the solenoid coil 110. The object 140 can be configured to be engaged with the plunger 130. The object 140 may be, for example, a valve, a relay, or a contactor. Hereinafter, the system 100 including a contactor and methods for detecting the movement of the plunger 130 according to some example embodiments will be described.

In an example embodiment, as illustrated in FIG. 1, the object 140 may be a contactor (identified as contactor 140) for connecting and breaking power supply lines in a vehicle. Required curves and/or profiles of current flowing in the solenoid coil 110 need to be detected and monitored to ensure proper operation of the contactor 140.

Referring to FIG. 1, the system 100 may further include a contact 142 that is coupled with the plunger 130. The contact 142 can move in two directions (e.g., ±y directions as shown in FIG. 1) to be engaged with the contactor 140. The plunger 130 may include a movable portion 136, a stationary portion 134, and a spring 132 connecting the movable portion 136 to the stationary portion 134 that keeps the plunger 130 open or closed. The stationary portion 134 of the plunger 130 may be coupled with the contact 142 through an additional spring 144.

When there is no voltage applied across the solenoid coil 110, there is no magnetic field generated. The spring 132 may keep the movable portion 136 of the plunger 130 all the way down inside the solenoid coil 110 and the plunger 130 is open. When a voltage is applied across the solenoid coil 110, a current starts building up and the movable portion 136 of the plunger 130 starts moving. As the movable portion 136 starts moving up, an induced current is generated in the solenoid coil 110 which is opposite to the applied current, and an overall current flowing in the solenoid coil 110 starts decreasing. As the movable portion 136 starts moving up and hits the stationary portion 134, the movable portion 136 cannot move further and physically stops, and the overall current starts increasing again.

When a voltage is applied to the solenoid coil 110, the applied current starts to flow in the solenoid coil 110 and a force is exerted on the plunger 130. When that force exceeds the mechanical force applied by the spring 132 and static friction, the plunger 130 starts moving. When the plunger 130 is moving, it generates the induced current in the solenoid coil 110 which is opposite to the applied current. This opposite induced current may reduce the overall current flowing in the solenoid coil 110. Thus, the reduction in the overall current may be used to detect when the plunger 130 starts moving.

The plunger 130 may keep moving until it is stopped mechanically, being pulled all the way into or pushed all the way out of the solenoid coil 110. This abrupt stop in the motion may cause the overall current to increase again.

Additionally, when the applied current is applied to the solenoid coil 110, a force is generated on the plunger 130 and moves the plunger 130 towards the contactor 140. At turn off, there is no current. The spring 132 opens the contact and brings the plunger away from the contactor.

The movement of the plunger 130 may be detected by the controller 120. The controller 120 may include a core element 122 configured to detect and measure the overall current flowing in the solenoid coil 110. The controller 120 can be configured to generate a first derivative signal waveform of the overall current, identify whether there is at least one zero crossing point in the first derivative signal waveform, and detect the plunger movement condition according to an identification result indicating whether there is at least one zero crossing point in the first derivative signal waveform. The core element 122 may be software, hardware, or a combination of software and hardware. In one embodiment, the core element 122 may include analog, digital or a combination of analog and digital components, such as a differentiator, configured to generate a first derivative signal by differentiating the current flowing in the solenoid coil 110. The controller 120 can generate a waveform of the first derivative signal (e.g., the first derivative signal waveform) generated by the core element 122. In another embodiment, the core element 122 can include, for example, an analog-to-digital converter (ADC) configured to convert the current flowing in the solenoid coil 110 into a digital representation. The digital representation can be outputted as a digital input signal to the controller 120 and controller 120 can generate the first derivative signal waveform using the digital input signal. In another embodiment, the core element 122 can be a programmable integrated circuit (IC) chip that can be programmed to execute program code for performing plunger movement detection described in the present disclosure.

Figure 2:
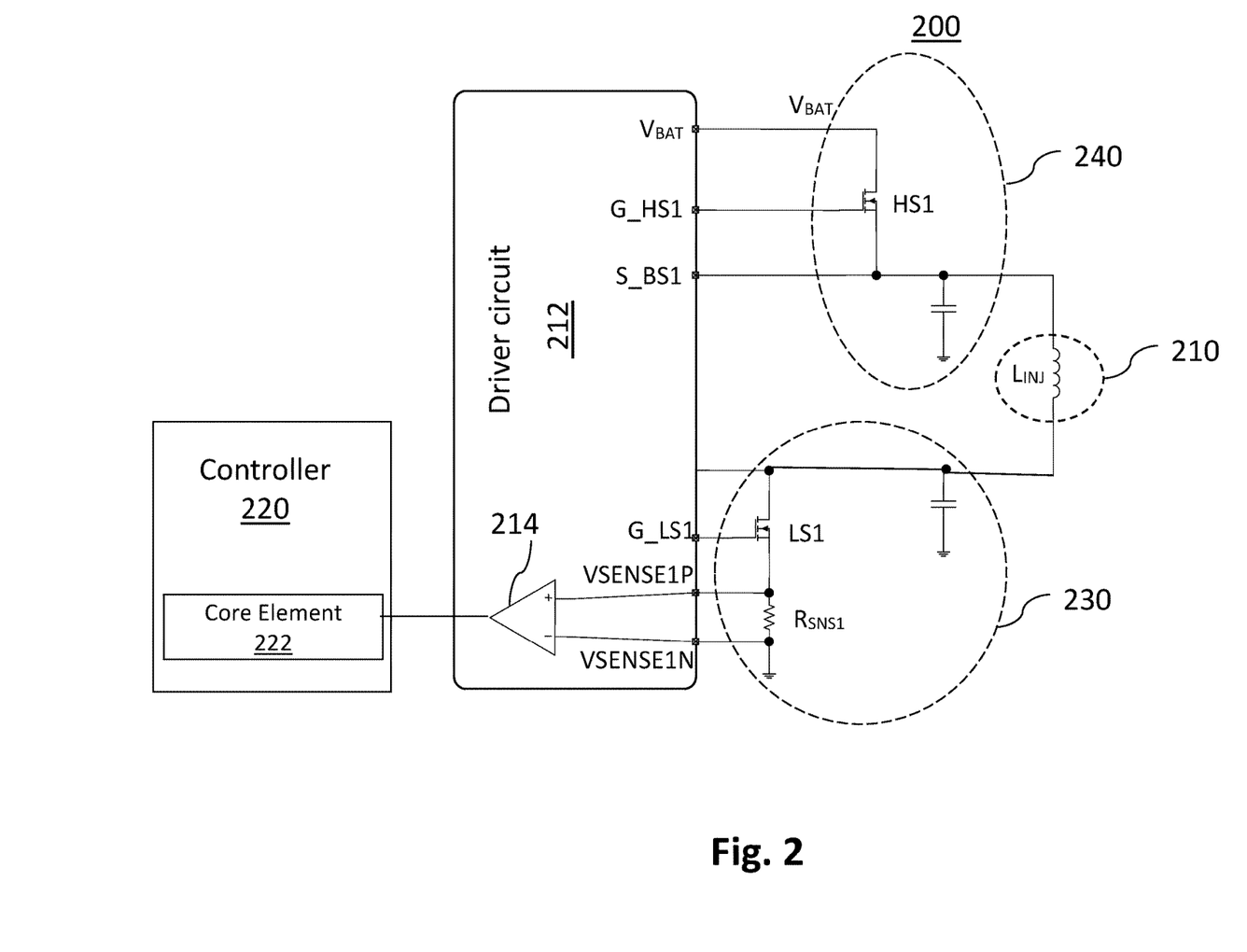
FIG. 2 is a diagram illustrating a system that can implement plunger movement detection according to an example embodiment.

FIG. 2 is a diagram illustrating a system 200 that can implement plunger movement detection according to an example embodiment.

As illustrated in FIG. 2, the system 200 may be a hardware implementation including a driver circuit 212 configured to drive a solenoid having a solenoid coil 210. The solenoid coil 210 can be represented by an inductive load $L_{INJ}$. The system 200 can further include a controller 220 configured to detect a plunger (not shown) movement with respect to the solenoid coil 210. The plunger movement detection may rely on the fact that the movement of the plunger inside the solenoid coil 210 may cause a change in magnetic flux which induces a counter electromotive force (Counter EMF, or often called Back EMF). This Back EMF may be detected in form of a current change in the solenoid coil 210. Hence, the plunger movement detection may be implemented by monitoring the current flowing in the solenoid coil 210. In one example embodiment, the hardware implementation shown in FIG. 2 may be implemented in a semiconductor device.

Referring to FIG. 2, to turn on the solenoid coil 210, apply a voltage $V_{BAT}$ across the inductive load $L_{INJ}$. An applied current starts building up in the inductive load $L_{INJ}$. When there is enough applied current, the plunger will start to move. In automobile application, the voltage $V_{BAT}$ may be 12V.

To turn on the inductive load $L_{INJ}$, turn on a low side switch LS1. When the low side switch LS1 is on, a whole low side circuit 230 is pulled down to ground through a sense resistor $R_{SNS1}$ and the overall current flowing in the solenoid coil 210 may be sensed and detected. The low side circuit 230 is continuously on when the inductive load $L_{INJ}$ is on. On a high side circuit 240, turn on a high side switch HS1 may build up the applied current. Once the overall current flowing in the solenoid coil 210 is at a predefined level, pulse width modulation (PWM) may be used to regulate and maintain the overall current at the predefined level, and a current waveform may be generated.

Although the low side switch LS1 and the high side switch HS1 in FIG. 2 are illustrated as metal-oxide-semiconductor field-effect transistor (MOSFET) transistors, other transistor types may be used. For example, in some embodiments, NPN BJTs and/or PNP BJTs may be used if applicable. In these or other embodiments, one or more other transistors such as junction gate field-effect transistors (JFET), or insulated gate bipolar transistors may be used where applicable.

The overall current flowing in the solenoid coil 210 may be detected using the sense resistor $R_{SNS1}$ and the voltage across the sense resistor $R_{SNS1}$ may be amplified by a driver 214 in the driver circuit 212 and fed to the controller 220. The driver 214 may be a programmable and drivable buffer, an operational amplifier (OPAMP), a power gain amplifier (PGA), or other type of amplifiers.

The controller 220 may be implemented together with the driver circuit 212 in an IC chip or stay alone. The controller 220 may include a core element 222 configured to detect and measure the overall current flowing in the solenoid coil 210, generate a first derivative signal waveform of the overall current, identify whether there is at least one zero crossing point in the first derivative signal waveform, and detect the plunger movement condition according to an identification result indicating whether there is at least one zero crossing point in the first derivative signal waveform. The core element 222 may be software, hardware, or a combination of software and hardware. The core element 222 may be implemented using analog, digital or a combination of analog and digital techniques.

The first derivative signal waveform may be generated and the zero crossing points may be identified, detected, and/or monitored using analog, digital, or a combination of analog and digital techniques. For example, an RC circuit may be used to generate a first derivative signal waveform. The first derivative signal waveform may be monitored and compared to a predetermined zero crossing value using analog comparator.

In the present disclosure, the first derivative signal waveform may be generated and the zero crossing points may be identified, detected, and/or monitored using digital techniques that include a discrete differentiation at a predetermined sampling rate. For example, the controller (220 may be an a microcontroller unit MCU) having a digital core element 222 that includes an ADC to differentiate and detect the current. Output of the driver 214 may go outside of the driver circuit 212 and may connect outside to the ADC. The ADC may sample the current value at a predetermined sampling rate.

Conventional systems may need to use a comparator to compare known current waveforms with the current flowing through the solenoid coil 210. In an aspect, as a temperature of an operating environment of system 100 changes, the waveform of the current flowing through the solenoid coil 210 may change as well. In another aspect, different power supply voltages being applied to the same system may produce different current waveforms as well. Thus, it may not be reliable to use the current waveform to detect plunger movement conditions. The utilization of the first derivative signal waveform, as described herein, may allow various plunger movement conditions to be detected regardless of variations such as temperature variations and power supply voltage changes. Features in the first derivative signal waveform of the current, such as zero crossing points, may highlight changes to the current flowing through the solenoid coil 210 regardless of how the original current waveform changes. Further, differentiation for generating the first derivative signal waveform may be accomplished using various types of implementation, such as analog circuits, digital circuits, software or firmware.

Figure 3:
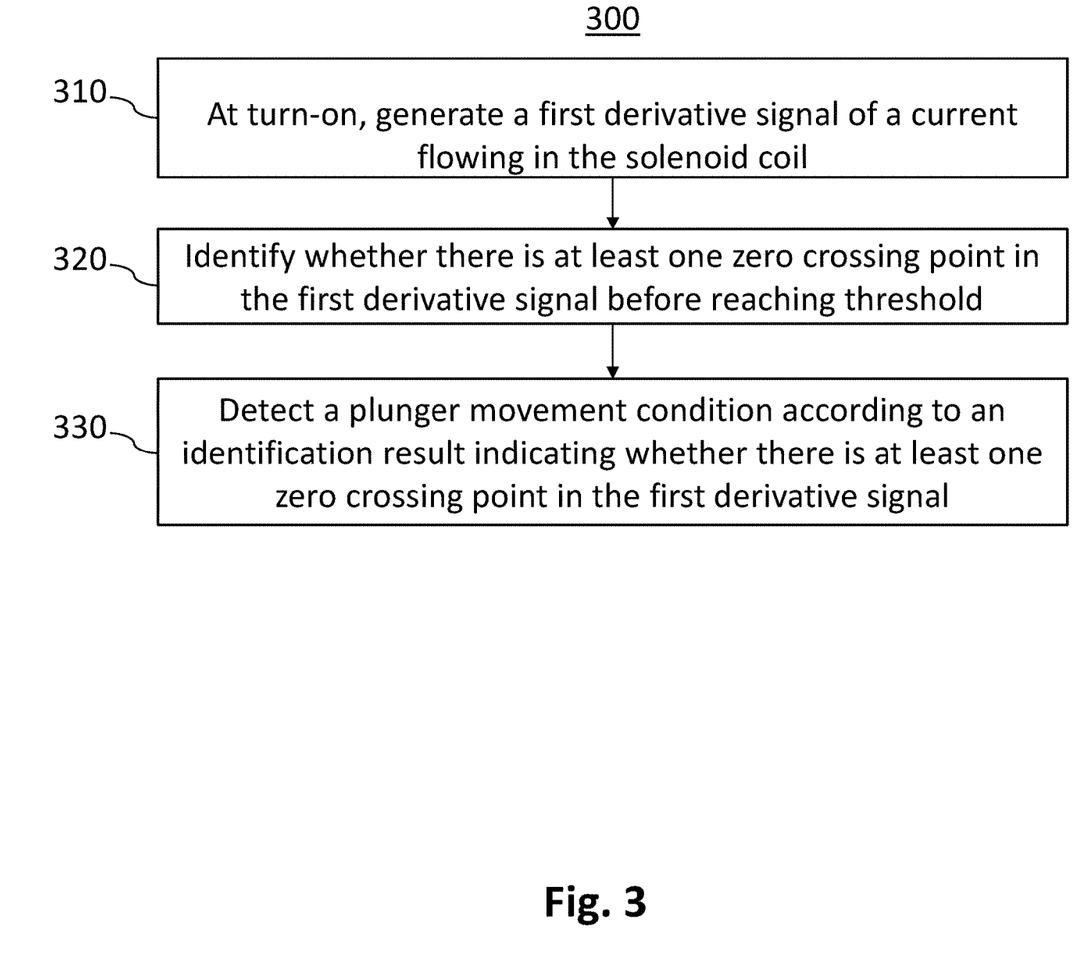
FIG. 3 is a flowchart illustrating a process of implementing plunger movement detection according to an example embodiment.

FIG. 3 is a flowchart of an example process that may implement plunger movement detection according to an example embodiment.

A process 300 in FIG. 3 may be implemented using, for example, the system 100 discussed above. The process 300 may include one or more operations, actions, or functions as illustrated by one or more of blocks 310, 320 and/or 330. Although illustrated as discrete blocks, various blocks may be divided into additional blocks, combined into fewer blocks, eliminated, performed in different order, or performed in parallel, depending on the desired implementation.

The process 300 may begin at block 310. At block 310, a circuit of a controller may generate a first derivative signal waveform of a current flowing in the solenoid coil. In one embodiment, the circuit of the controller can generate the first derivative signal waveform at turn-on (e.g., at a start-up time of system 200 shown in FIG. 2). In an example embodiment, the controller may be an MCU having a digital core element that includes an ADC to detect, monitor, and differentiate the current. The ADC may sample the current value at a predetermined sampling rate using digital techniques that include a discrete differentiation, and waveforms may be generated to represent the current and its corresponding first derivative signal waveform accordingly.

The process 300 may proceed from block 310 to block 320. At block 320, the controller and/or the circuit in the controller may identify whether there is at least one zero crossing point in the first derivative signal waveform. In one embodiment, the controller can identify whether there is at least one zero crossing point in the first derivative signal waveform before the current reaches a predetermined threshold current value (e.g., see FIG. 6 and corresponding descriptions below). Identification of zero crossing point before this predetermined threshold current value can allow the zero-crossing point to be identified before the current flowing in the solenoid coil is being regulated at a predefined level by PWM. Peaks and valleys of the current waveform after the current is regulated by PWM can create additional zero crossing points in the first derivative signal waveform that are irrelevant to detection of plunger movement. Hence, it may be desirable to identify zero crossing points for plunger movement detection before the current flowing in the solenoid coil is being regulated at a predefined level by PWM. In an example embodiment, the identification of the at least one zero crossing point in the first derivative signal waveform may be done digitally by looking at the first derivative signal waveform generated at block 310.

The process 300 may proceed from block 320 to block 330. At block 330, the controller and/or its core element may detect a plunger movement condition according to an identification result indicating whether there is at least one zero crossing point in the first derivative signal waveform. In an example embodiment, the detection of the plunger movement condition may be done digitally by looking at the current waveform and its first derivative signal waveform generated at block 310. Differentiation of the current is easier to detect when compared to detecting from the current waveform directly.

FIG. 4 to FIG. 10B are exemplary diagrams relating to implementations of plunger movement detection according to various example embodiments.

Hereinafter, a process of detecting that the plunger starts and/or stops moving according to some example embodiments will be described referring to FIG. 4 and FIG. 5.

Figure 4:
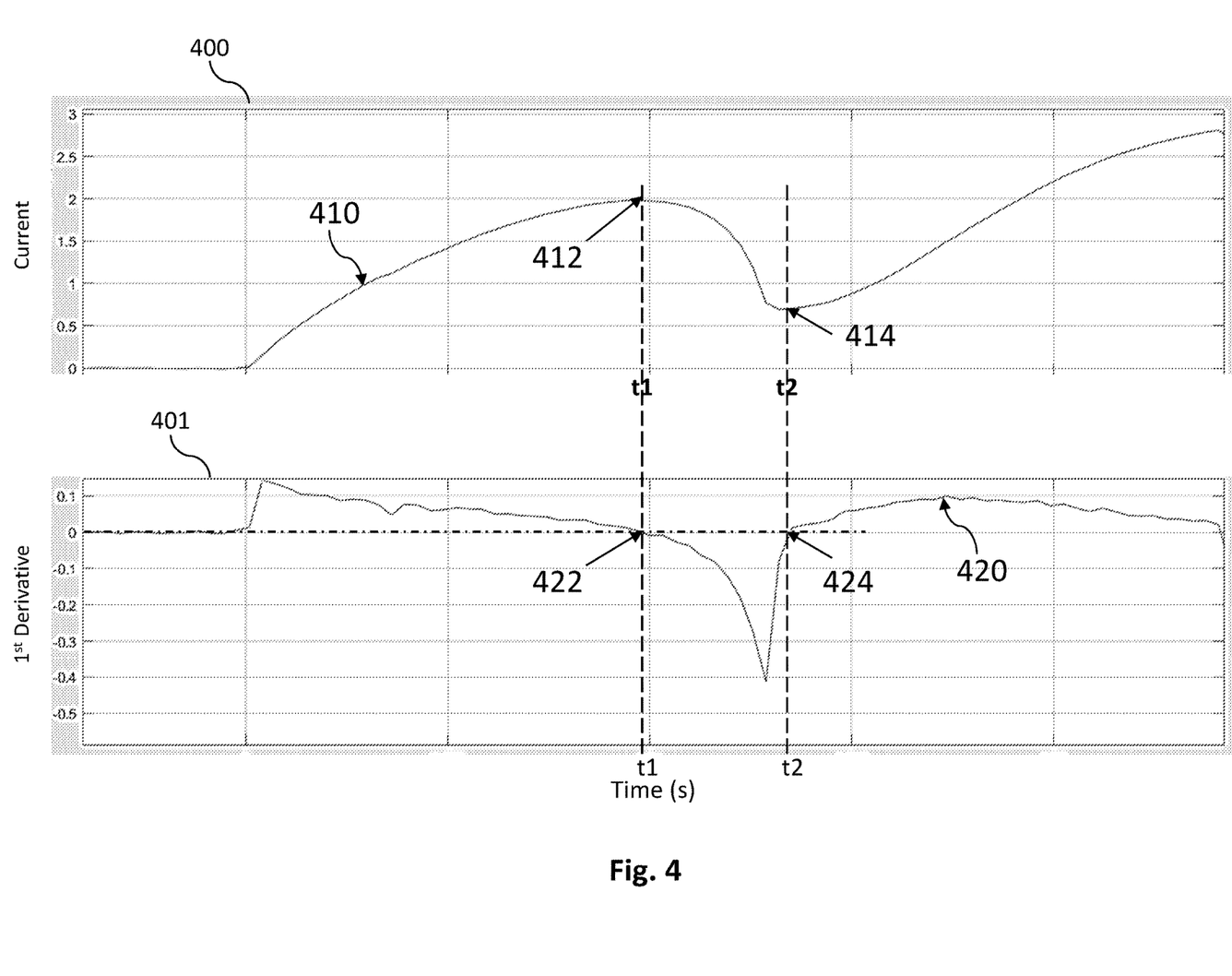
FIG. 4 is an exemplary diagram relating to an implementation of plunger movement detection according to an example embodiment.

Referring to FIG. 4, a diagram 400 illustrates a digitized current waveform 410 that represents a current flowing in a solenoid coil, and a diagram 401 illustrates a waveform 420 representing a first derivative signal waveform that corresponds to the current waveform 410. Both the current waveform 410 and the first derivative signal waveform 420 may be generated by block 310 in process 300. The method of detecting that the plunger starts and/or stops moving may include identifying whether there is at least one zero crossing point in the first derivative signal waveform 420.

Referring to diagrams 400, 401, the first derivative signal waveform 420 shows a positive to negative zero crossing point 422 at a first time instance t1, and a negative to positive zero crossing point 424 at a second time instance t2. When the first derivative signal waveform 420 is positive, the current increases. When the first derivative signal waveform 420 is negative, the current decreases. Thus, at the first time instance t1 when the positive to negative zero crossing point 422 is identified, the current starts decreasing and a peak current value 412 may be detected, measured, and recorded. Similarly, at the second time instance t2 when the negative to positive zero crossing point 424 is identified, the current starts increasing and a valley current value 414 may be detected, measured, and recorded.

Hence, at the first time instance t1 when the positive to negative zero crossing point 422 is identified in the first derivative signal waveform 420, a plunger movement condition may be detected indicating that the plunger starts moving. Similarly, at the second time instance t2 when the negative to positive zero crossing point 424 is identified in the first derivative signal waveform 420, the plunger movement condition may be detected indicating that the plunger stops moving.

Figure 5:
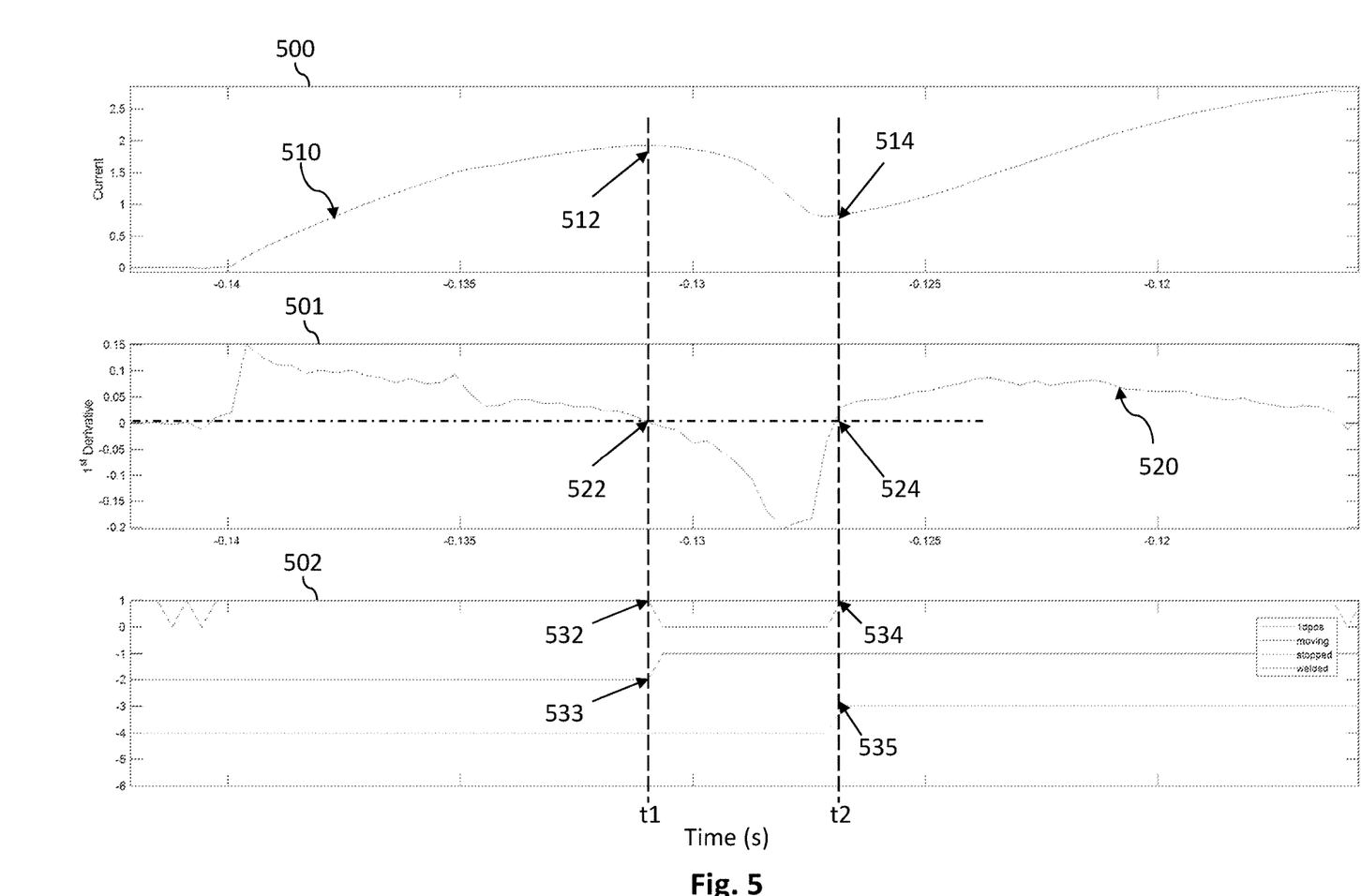
FIG. 5 is an exemplary diagram relating to another implementation of plunger movement detection according to an example embodiment.

FIG. 5 includes a diagram 500 that is identical to diagram 400 of FIG. 4, and includes a diagram 501 that is identical to diagram 401 of FIG. 4. FIG. 5 further includes a diagram 502 that illustrates an embodiment for detecting that the plunger starts and/or stops moving.

Referring to FIG. 5, at a first time instance t1 when a positive to negative zero crossing point 522 is identified in a first derivative signal waveform 520, the current 510 starts decreasing and a peak current value 512 may be measured. A positive first derivative signal waveform may go from a logic high 532 to a logic low, and a moving signal waveform may go from a logic low 533 to a logic high, as illustrated in the diagram 502. A plunger movement condition may be detected indicating that the plunger starts moving.

Similarly, at a second time instance t2 when a negative to positive zero crossing point 524 is identified in the first derivative signal waveform 520, the current 510 starts increasing and a valley current value 514 may be measured. A positive first derivative signal waveform may go from a logic low to a logic high 534, and a stopping signal waveform may go from a logic low to a logic high 535, as illustrated in the diagram 502. A plunger movement condition may be detected indicating that the plunger stops moving.

Figure 6:
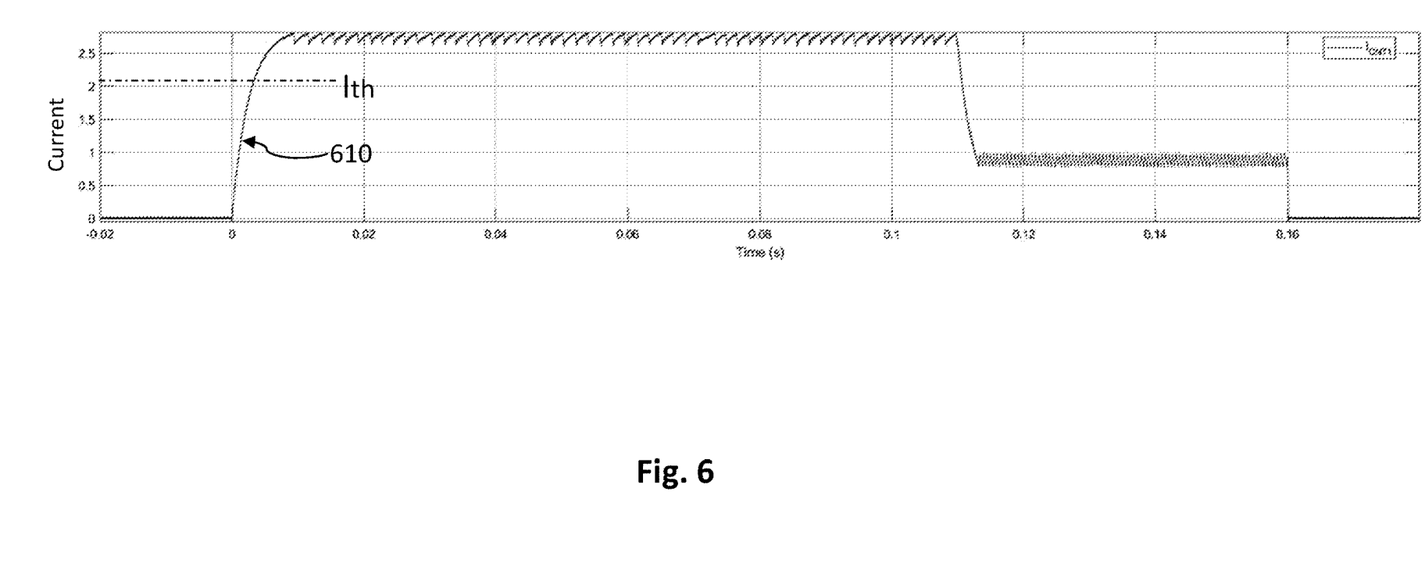
FIG. 6 is an exemplary diagram relating to another implementation of plunger movement detection according to an example embodiment.

FIG. 6 is an exemplary diagram for detecting that a plunger is in an idle condition according to some example embodiments using the process 300. In some example embodiments, the plunger may be entirely out of a solenoid coil and/or a contactor, or the plunger may be stuck in the solenoid coil preventing it from moving when being activated. In such cases, there will be no plunger movement. Referring to FIG. 1, the plunger 130 can be stuck or welded in response to springs 132,144 working against each other. The turn on current waveform may be a simple RL behavior without a peak and/or a valley, as illustrated in FIG. 6.

Referring to FIG. 6, a current waveform 610 shows neither a peak value nor a valley value. Therefore, though not shown in FIG. 6, there will be no zero crossing points detected in its first derivative signal waveform. Accordingly, the method of detecting a plunger in an idle condition may include identifying whether there is at least one zero crossing point in the first derivative signal waveform. If the identification result indicates no zero crossing point, the method may further include measuring a current value of the current flowing in the solenoid coil, and comparing the current value to a predetermined threshold current value (labeled as Ith in FIG. 6). In an example embodiment, the current value may be measured from the current waveform generated by block 310 in the process 300 at a predetermined sampling rate. When the current value exceeds the predetermined threshold current value, a plunger in an idle condition may be detected, and the time when the current value reaches the predetermined threshold current value may be recorded for additional diagnosis.

In some example embodiments, a plunger may be restricted, such as being attached to a solenoid coil, or sticking in the solenoid coil, and/or a contact may be welded with a contactor. Solenoids with a sticking plunger exhibit a similar behavior at turn on as a contactor with welded contacts. In both cases, the plunger movement is restricted mechanically, causing differences in transient current waveforms. The restricted plunger movement condition may be detected by detecting the movement of the plunger using the process 300 and applying the method described above with respect to FIG. 4, and comparing to normal behavior. A restricted plunger movement may present a smaller difference in the transient current amplitude caused by the restricted movement, smaller current peak amplitude and/or larger current valley amplitude, a shorter transition time in a transient current waveform, and a slower di/dt caused by the plunger being partially closed which increases the inductance of the coil.

Figure 7A:
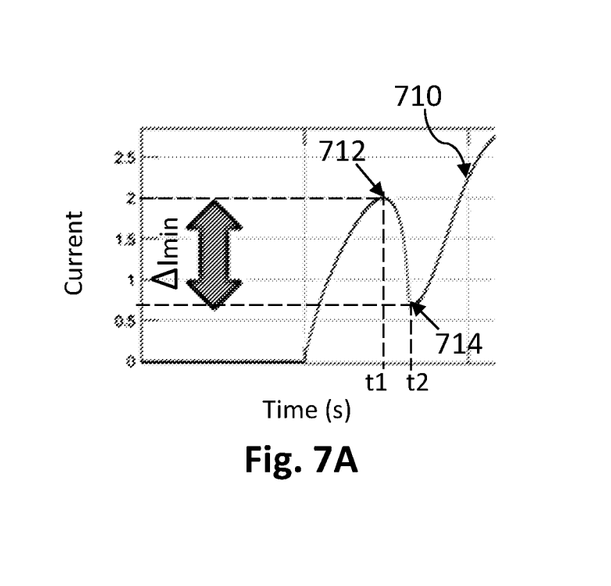
FIG. 7A is an exemplary diagram relating to another implementation of plunger movement detection according to an example embodiment.
Figure 7B:
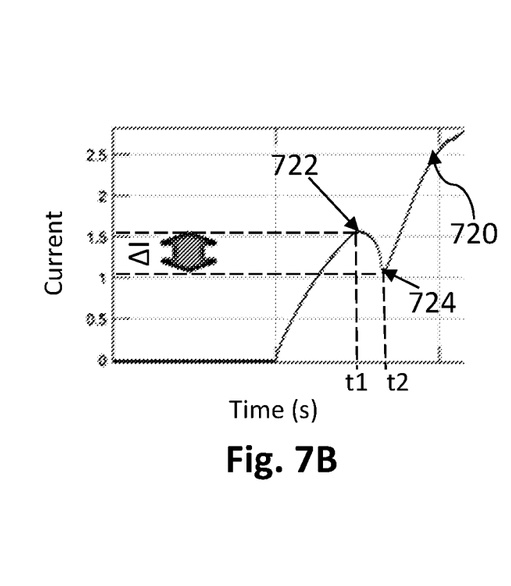
FIG. 7B is another exemplary diagram relating to another implementation of plunger movement detection according to an example embodiment.

FIGS. 7A and 7B are exemplary diagrams for using a peak-valley current difference to detect a restricted plunger movement condition.

Referring to FIGS. 7A and 7B, FIG. 7A illustrates a digitized current waveform 710 that represents a current flowing in the solenoid coil when the plunger movement is under a normal operating condition, and FIG. 7B illustrates a digitized current waveform 720 that represents a current flowing in the solenoid coil when the plunger movement is restricted.

By using techniques described above with respect to FIG. 4, at a first time instance t1 when a positive to negative zero crossing point is identified in a first derivative signal waveform of a current flowing in the solenoid coil, the current starts decreasing and a current peak, such as the current peak 712 in FIG. 7A and the current peak 722 in FIG. 7B, may be detected and measured. Similarly, at a second time instance t2 when a negative to positive zero crossing point is identified in the first derivative signal waveform of the current flowing in the solenoid coil, the current starts increasing and a current valley, such as the current valley 714 in FIG. 7A and the current valley 724 in FIG. 7B, may be detected and measured. A peak-valley current difference $\Delta I$ may be defined as $\Delta I = I_{peak} - I_{valley}$, wherein Ipeak is a peak current value at the first time instance t1 and Ivalley is a valley current value at the second time instance t2, respectively. A minimum peak-valley current difference $\Delta I_{min}$, as illustrated in FIG. 7A, may be predetermined by characterization under normal operating conditions. If a measured peak-valley current difference $\Delta I$ is less than or equal to the predetermined minimum peak-valley current difference $\Delta I_{min}$, a restricted plunger movement condition (e.g., sticking or welded) may be detected, as illustrated in FIG. 7B.

Depending on the solenoid characteristics and operating voltage (e.g., a battery voltage), it may be necessary to use different thresholds based on the operating voltage. This may be determined during characterization. If different thresholds are needed, an additional ADC may be used to monitor the operating voltage so as to allow variable thresholds to be used.

Figure 8A:
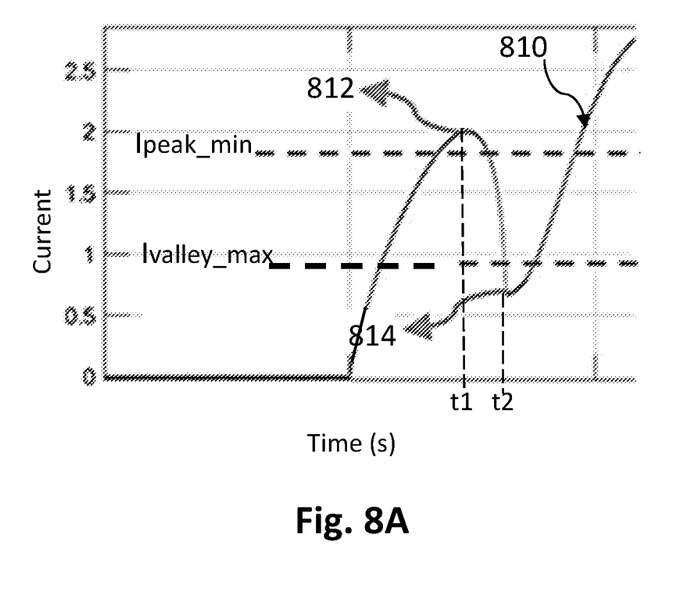
FIG. 8A is an exemplary diagram relating to another implementation of plunger movement detection according to an example embodiment.
Figure 8B:
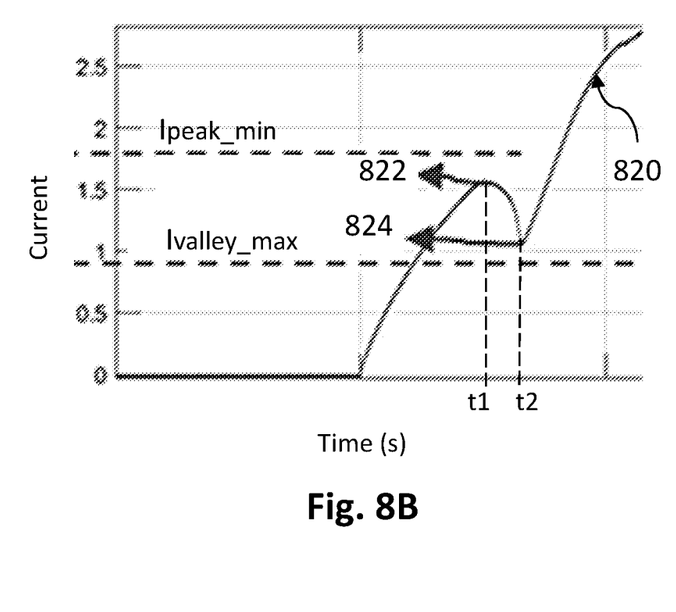
FIG. 8B is an exemplary diagram relating to another implementation of plunger movement detection according to an example embodiment.

FIGS. 8A and 8B are exemplary diagrams for checking the peak and valley current values for a given operation voltage to detect the restricted plunger movement condition.

Referring to FIGS. 8A and 8B, FIG. 8A illustrates a digitized current waveform 810 that represents a current flowing in the solenoid coil when the plunger movement is under a normal operating condition, and FIG. 8B illustrates a digitized current waveform 820 that represents a current flowing in the solenoid coil when the plunger movement is restricted.

Identical to the description with respect to FIGS. 7A and 7B, by applying the techniques described above with respect to FIG. 4, at a first time instance t1 when a positive to negative zero crossing point is identified in a first derivative signal waveform, a current peak, such as the current peak 812 in FIG. 8A and the current peak 822 in FIG. 8B, may be detected and measured. Similarly, at a second time instance t2 when a negative to positive zero crossing point is identified in the first derivative signal waveform, a current valley, such as the current valley 814 in FIG. 8A and the current valley 824 in FIG. 8B, may be detected and measured. A minimum peak current Ipeak_min and/or a maximum valley current Ivalley_max, as illustrated in FIGS. 8A and 8B, may be predetermined based on characterization of the contactor over an operation voltage. If the measured peak current value Ipeak is more than or equal to the predetermined minimum peak current Ipeak_min, and the measured valley current value Ivalley is less than or equal to the predetermined maximum valley current Ivalley_max, the plunger movement is under normal condition, as illustrated in FIG. 8A. If the measured peak current value Ipeak is less than the predetermined minimum peak current Ipeak_min, and/or the measured valley current value Ivalley is more than the predetermined maximum valley current Ivalley_max, a restricted plunger movement condition (e.g., sticking or welded) may be detected, as illustrated in FIG. 8B.

Figure 9A:
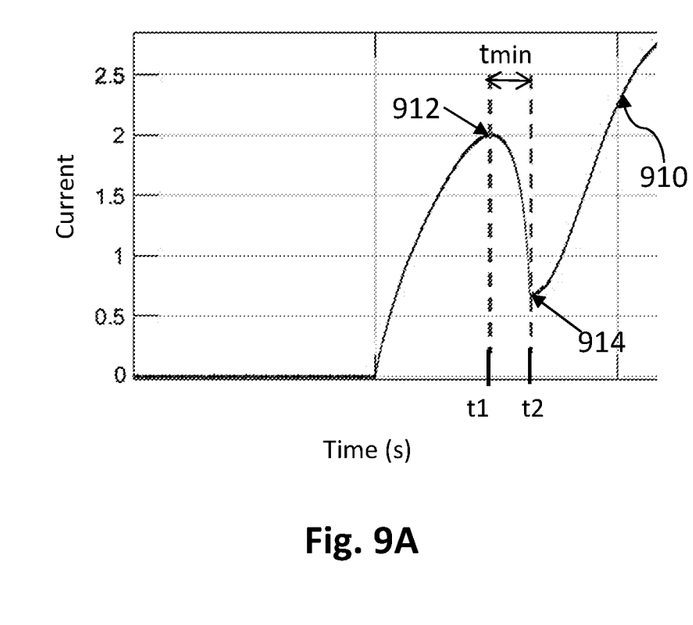
FIG. 9A is an exemplary diagram relating to another implementation of plunger movement detection according to an example embodiment.
Figure 9B:
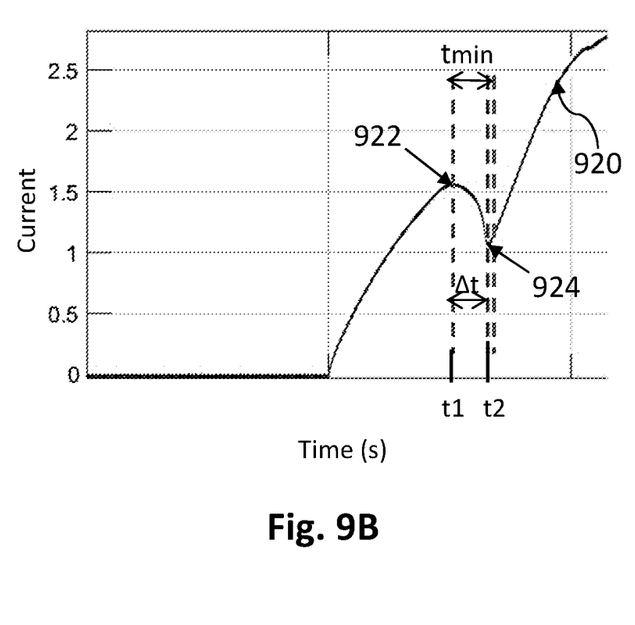
FIG. 9B is an exemplary diagram relating to another implementation of plunger movement detection according to an example embodiment.

FIGS. 9A and 9B are exemplary diagrams for checking the transition time duration of a transient current signal waveform to detect the restricted plunger movement condition.

Referring to FIGS. 9A and 9B, FIG. 9A illustrates a digitized current waveform 910 that represents a current flowing in the solenoid coil when the plunger movement is under a normal operating condition, and FIG. 9B illustrates a digitized current waveform 920 that represents a current flowing in the solenoid coil when the plunger movement is restricted.

By applying the techniques described above with respect to FIG. 4, at a first time instance t1 when a positive to negative zero crossing point is identified in a first derivative signal waveform, a current peak, such as the current peak 912 in FIG. 9A and the current peak 922 in FIG. 9B, may be detected and measured. Similarly, at a second time instance t2 when a negative to positive zero crossing point is identified in the first derivative signal waveform, a current valley, such as the current valley 914 in FIG. 9A and the current valley 924 in FIG. 9B, may be detected and measured. A transition time duration $\Delta t$ may be defined as $\Delta t = \Delta t2 - \Delta t1$. A minimum transition time duration tmin may be predetermined by characterization of the contactor under normal condition, as illustrated in FIG. 9A. If the measured transition time duration $\Delta t$ is less than the predetermined minimum transition time duration tmin, a restricted plunger movement condition (e.g., sticking or welded) may be detected, as illustrated in FIG. 9B.

Figure 10A:
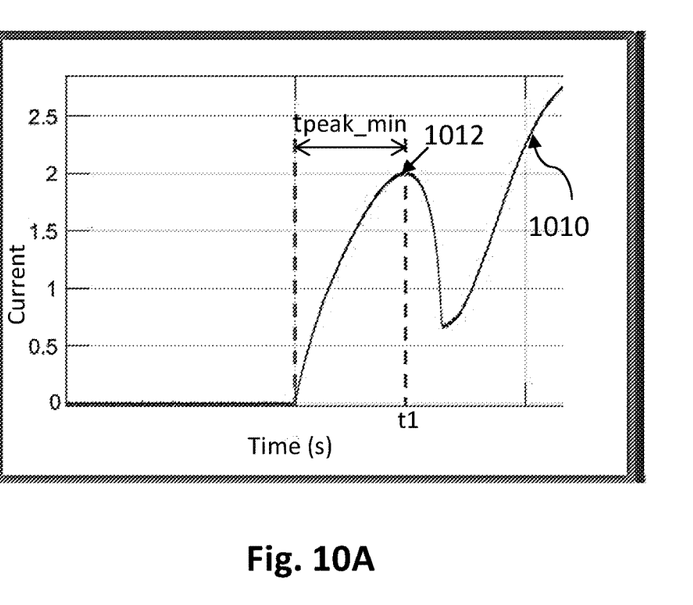
FIG. 10A is an exemplary diagram relating to another implementation of plunger movement detection according to an example embodiment.
Figure 10B:
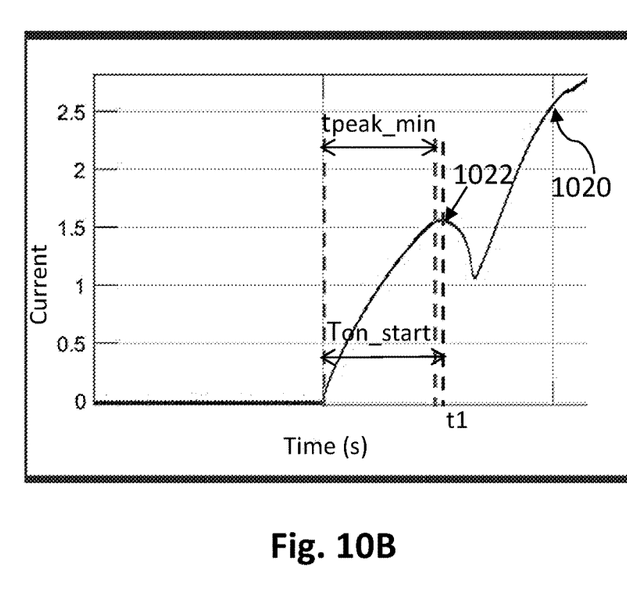
FIG. 10B is an exemplary diagram relating to another implementation of plunger movement detection according to an example embodiment.

FIGS. 10A and 10B are exemplary diagrams for checking the time duration from turn on to the current peak to detect the restricted plunger movement condition.

Referring to FIGS. 10A and 10B, FIG. 10A illustrates a digitized current waveform 1010 that represents a current flowing in the solenoid coil when the plunger movement is under a normal operating condition, and FIG. 10B illustrates a digitized current waveform 1020 that represents a current flowing in the solenoid coil when the plunger movement is restricted.

By applying the techniques described above with respect to FIG. 4, at a first time instance t1 when a positive to negative zero crossing point is identified in a first derivative signal waveform, a current peak, such as the current peak 1012 in FIG. 10A and the current peak 1022 in FIG. 10B, may be detected and measured. A minimum time to reach the current peak tpeak_min may be predetermined based on characterization of the contactor over an operation voltage, as illustrated in FIG. 10A. If the time duration to reach the current peak t1 is longer than the minimum time to reach the current peak tpeak_min, a restricted plunger movement condition (e.g., sticking or welded) may be detected, as illustrated in FIG. 10B.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method for detecting a plunger movement condition with respect to a solenoid coil, the method comprising:
   generating a first derivative signal waveform of a current flowing in the solenoid coil;
   identifying whether there is at least one zero crossing point in the first derivative signal waveform; and
   detecting the plunger movement condition according to an identification result indicating whether there is at least one zero crossing point in the first derivative signal waveform,
   wherein when the identification result shows no zero-crossing point, the method further comprises:
      measuring a current value of the current flowing in the solenoid coil; and
      comparing the current value to a predetermined threshold value, and wherein the detecting the plunger movement condition includes detecting that a plunger is idle when the current value exceeds the predetermined threshold value.

2. The method as claimed in claim 1, wherein:
the identification result shows a positive to negative zero crossing point at a first time instance; and
the detecting the plunger movement condition includes detecting that the plunger starts moving at the first time instance.

3. The method as claimed in claim 2, wherein:
the identification result further shows a negative to positive zero crossing point at a second time instance; and
the detecting the plunger movement condition further includes detecting that the plunger stopped moving at the second time instance.

4. The method as claimed in claim 3, further comprising:
measuring a first current value of the current flowing in the solenoid coil at the first time instance;
measuring a second current value of the current flowing in the solenoid coil at the second time instance; and
comparing a current difference between the first current value and the second current value to a predetermined minimum current difference value,
wherein the detecting the plunger movement condition includes detecting a restricted movement of the plunger in the solenoid coil when the current difference between the first current value and the second current value is less than or equal to the predetermined minimum current difference value.

5. The method as claimed in claim 3, further comprising:
measuring a first current value of the current flowing in the solenoid coil at the first time instance; and
measuring a second current value of the current flowing in the solenoid coil at the second time instance,
wherein the detecting the plunger movement condition includes detecting a restricted movement of the plunger in the solenoid coil when the first current value is lower than a predetermined minimum peak current value and/or the second current value is higher than a predetermined maximum valley current value.

6. The method as claimed in claim 3, further comprising:
comparing a time duration between the first time instance and the second time instance to a predetermined minimum time duration,
wherein the detecting the plunger movement condition includes detecting a restricted movement of the plunger in the solenoid coil when the time duration between the first time instance and the second time instance is shorter than the predetermined minimum time duration.

7. The method as claimed in claim 2, wherein the detecting the plunger movement condition includes detecting a restricted movement of the plunger in the solenoid coil when the first time instance is longer than a predetermined minimum time.

8. A semiconductor device comprising:
a controller configured to:
generate a first derivative signal waveform of a current flowing in a solenoid coil;
identify whether there is at least one zero crossing point in the first derivative signal waveform; and
detect a plunger movement condition according to an identification result indicating whether there is at least one zero crossing point in the first derivative signal waveform,
wherein when the identification result shows no zero-crossing point, the controller is further configured to:
measure a current value of the current flowing in the solenoid coil; and
compare the current value to a predetermined threshold value, and
wherein to detect the plunger movement condition includes to detect that a plunger is idle when the current value exceeds the predetermined threshold value.

9. The semiconductor device as claimed in claim 8, wherein:
the identification result shows a positive to negative zero crossing point at a first time instance; and
to detect the plunger movement condition includes to detect that the plunger starts moving at the first time instance.

10. The semiconductor device as claimed in claim 9, wherein:
the identification result further shows a negative to positive zero crossing point at a second time instance; and
to detect the plunger movement condition further includes to detect that the plunger stopped moving at the second time instance.

11. The semiconductor device as claimed in claim 10, the controller being further configured to:
measure a first current value of the current flowing in the solenoid coil at the first time instance;
measure a second current value of the current flowing in the solenoid coil at the second time instance; and
compare a current difference between the first current value and the second current value to a predetermined minimum current difference value,
wherein to detect the plunger movement condition includes to detect a restricted movement of the plunger in the solenoid coil when the current difference between the first current value and the second current value is less than or equal to the predetermined minimum current difference value.

12. The semiconductor device as claimed in claim 10, the controller being further configured to:
measure a first current value of the current flowing in the solenoid coil at the first time instance; and
measure a second current value of the current flowing in the solenoid coil at the second time instance,
wherein to detect the plunger movement condition includes to detect a restricted movement of the plunger in the solenoid coil when the first current value is lower than a predetermined minimum peak current value and/or the second current value is higher than a predetermined maximum valley current value.

13. The semiconductor device as claimed in claim 10, the controller being further configured to:
compare a time duration between the first time instance and the second time instance to a predetermined minimum time duration,
wherein to detect the plunger movement condition includes to detect a restricted movement of the plunger in the solenoid coil when the time duration between the first time instance and the second time instance is shorter than the predetermined minimum time duration.

14. The semiconductor device as claimed in claim 9, wherein to detect the plunger movement condition includes to detect a restricted movement of the plunger in the solenoid coil when the first time instance is longer than a predetermined minimum time.

15. A system comprising:
a plunger;
a solenoid coil; and
a controller configured to:

generate a first derivative signal waveform of a current flowing in the solenoid coil;

identify whether there is at least one zero crossing point in the first derivative signal waveform; and detect a plunger movement condition according to an identification result indicating whether there is at least one zero crossing point in the first derivative signal waveform, wherein when the identification result shows no zero-crossing point, the controller is further configured to:

measure a current value of the current flowing in the solenoid coil; and compare the current value to a predetermined threshold value, and wherein to detect the plunger movement condition includes to detect that the plunger is idle when the current value exceeds the predetermined threshold value.

16. The system as claimed in claim 15, wherein the plunger movement condition includes one or more of starting moving, stopping moving, idle, and restricted movement conditions.

\* \* \* \* \*